(12) United States Patent
Maeda (10) Patent No.: US 7,301,511 B2
(45) Date of Patent: Nov. 27, 2007

(54) EL DISPLAY, EL ILLUMINATION DEVICE AND DRIVING METHOD THEREFOR, LIQUID CRYSTAL DEVICE AND ELECTRONIC APPARATUS

(75) Inventor: Tsuyoshi Maeda, Yamanashi-ken (JP)

(73) Assignee: Seiko Epson Corporation, Tokyo (JP)

( * ) Notice: Subject to any disclaimer, the term of this patent is extended or adjusted under 35 U.S.C. 154(b) by 344 days.

(21) Appl. No.: 10/154,976

(22) Filed: May 28, 2002

(65) Prior Publication Data

US 2002/0190935 A1     Dec. 19, 2002

(30) Foreign Application Priority Data

Jun. 7, 2001  (JP) ............................. 2001-173106
Feb. 26, 2002  (JP) ............................. 2002-050471

(51) Int. Cl.
*G09G 3/30*     (2006.01)
(52) U.S. Cl. .......................................... 345/76; 345/36
(58) Field of Classification Search ................. 345/72, 345/76, 77, 78, 79, 80, 36, 83, 84, 204
See application file for complete search history.

(56) References Cited

U.S. PATENT DOCUMENTS

| | | | |
|---|---|---|---|
| 4,539,507 A * | 9/1985 | VanSlyke et al. ............ | 313/504 |
| 5,315,311 A * | 5/1994 | Honkala ....................... | 345/76 |
| 5,684,365 A * | 11/1997 | Tang et al. ............... | 315/169.3 |
| 6,501,227 B1 | 12/2002 | Koyama | |
| 6,566,808 B1 * | 5/2003 | Duggal et al. ............... | 313/512 |
| 6,677,621 B2 * | 1/2004 | Yamazaki et al. .......... | 257/103 |
| 6,710,541 B2 * | 3/2004 | He et al. ..................... | 313/504 |
| 6,747,617 B1 * | 6/2004 | Kawashima ................. | 345/76 |

FOREIGN PATENT DOCUMENTS

| | | |
|---|---|---|
| CN | 1290041 A | 4/2001 |
| JP | A-11-260563 | 9/1999 |

* cited by examiner

*Primary Examiner*—Richard Hjerpe
*Assistant Examiner*—Jean Lesperance
(74) *Attorney, Agent, or Firm*—Oliff & Berridge, PLC

(57) ABSTRACT

The invention decreases the power consumption in an EL display and illumination device that each use EL elements. In an EL display or EL illumination device that use EL elements, the magnitude of the voltage or current that is applied to the EL elements during driving is set to a voltage value or current value (V1 to V2) at which the luminous efficiency of the EL elements is 80% or more (0.8P to P) of the maximum P.

16 Claims, 7 Drawing Sheets

EL DISPLAY, EL ILLUMINATION DEVICE AND DRIVING METHOD THEREFOR, LIQUID CRYSTAL DEVICE AND ELECTRONIC APPARATUS

BACKGROUND OF THE INVENTION

1. Field of Invention

The present invention relates to an EL display and an illumination device that each utilize the luminous characteristics of an EL element (electroluminescence element). In particular, the invention relates to a driving method that is effective to decrease power consumption for driving an EL element.

2. Description of Related Art

A related art display and illumination device includes an EL element that utilizes electroluminescence.

An exemplary EL element includes a transparent electrode and a metal electrode which are arranged opposite to each other, with an organic layer provided therebetween, and containing at least a luminescent layer. In the EL element having this construction, when a voltage or current is applied between the transparent electrode and the metal electrode to pass a current through the luminescent layer, the luminescent layer emits light, and the light emitted from the luminescent layer is emitted to the exterior of the structure through the transparent electrode. The luminance of light emitted from the EL element generally increases as the current flowing through the luminescent layer increases.

SUMMARY OF THE INVENTION

The EL display and illumination device are required to produce bright display and high-luminance light emission, and thus a high voltage is applied to the EL element to increase the density of the current flowing through the luminescent layer, thereby obtaining high-luminance light emission. However, this causes high power consumption, which is disadvantageous.

The present invention addresses the above-described circumstances, and decreases the power consumption of an EL display and illumination device that each use an EL element.

As a result of intensive research on the luminescence characteristics of an EL element, the inventors made the following discovery: The density (unit: $mA/cm^2$) of a current flowing through the luminescent layer of the EL element and luminance (unit: $cd/m^2$) have a relationship in which the luminance increases as the current density increases, as shown by a solid line in FIG. 4. On the other hand, the current density and luminous efficiency (unit: 1 m/W) have a relationship in which, in the region of low current densities, the luminous efficiency increases as the current density increases, but the luminous efficiency reaches a peak and thereafter decreases as the current density increases, as shown by a broken line in FIG. 4.

This discovery reveals that where a high voltage is applied to the EL element to increase the current density in order to obtain high-luminance light emission, the luminous efficiency significantly deteriorates to cause a factor of an increase in power consumption.

In the specification, the luminous efficiency is represented by a value obtained by measuring the density of a current flowing through the EL element with the voltage or current applied to the EL element, and the luminance of the light emitted from the EL element, converting the luminance into a light flux (unit: 1 m) and dividing the light flux by power consumption (unit: W).

Accordingly, the present invention efficiently decreases power consumption by using a region of highest luminous efficiency as a condition for driving the EL element.

Figure 5:
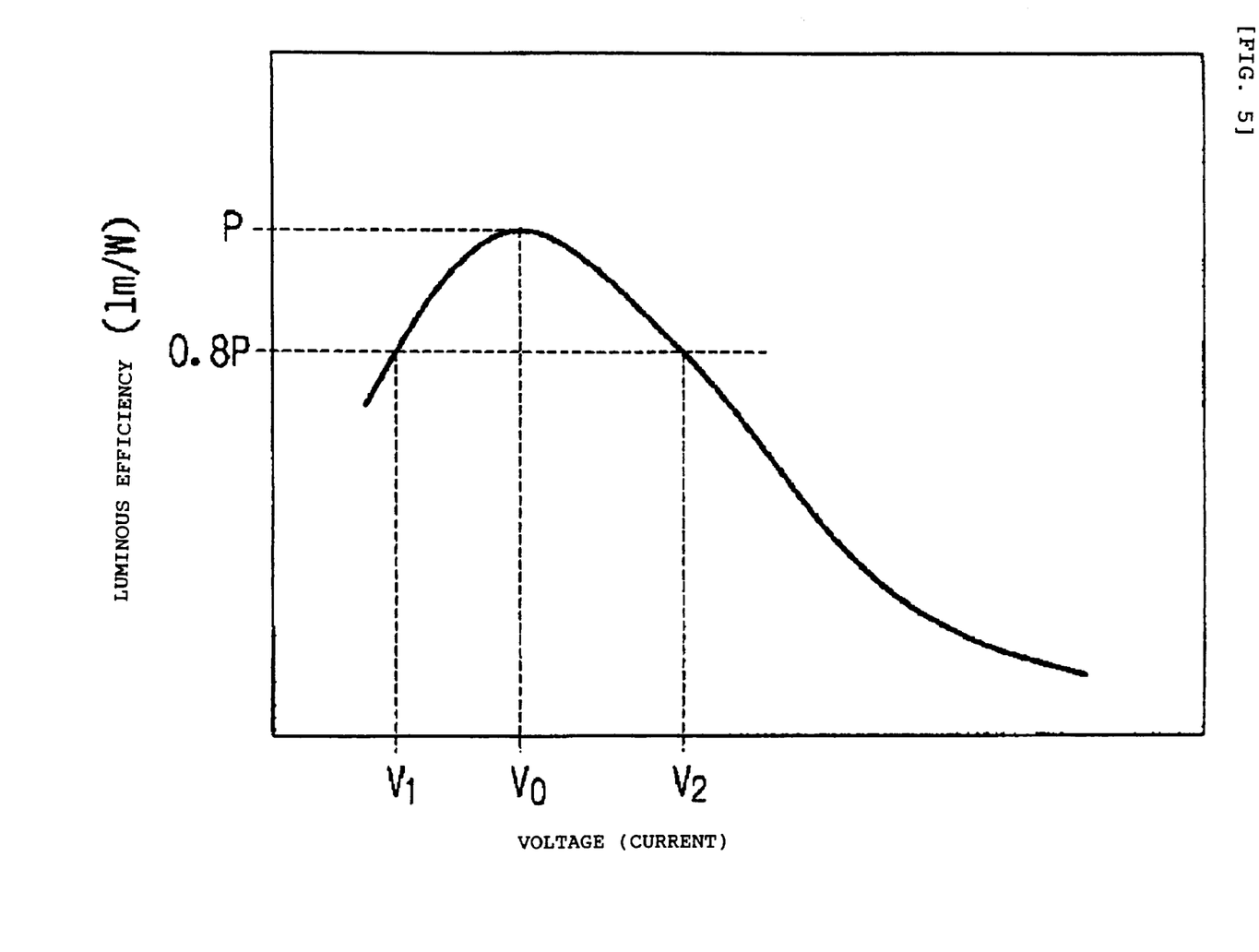
FIG. 5 is a graph illustrating the setting range of a voltage or current in the present invention.

Specifically, the relationship between the magnitude (or the current value with the applied voltage) of the voltage or current applied to the EL element and the luminous efficiency obtained with the applied voltage or current value may be previously determined, as shown in FIG. 5, for example. As a condition for driving the EL element, the value of the voltage or current applied to the EL element is preferably set to applied voltage value V0 or a value near V0 at which the luminous efficiency is at peak P. Particularly, in order to obtain practical luminance, while increasing the luminous efficiency to decrease power consumption, the voltage or current applied to the EL element is preferably set in the range of applied voltage values (current values) V1 to V2 or current values in which the luminous efficiency is 80% or more of the maximum P. Furthermore, where the applied voltage (or current value) can be changed within the range of V1 to V2, the luminance of emitted light can be controlled, thereby making it possible to preferably comply with halftone display in a color EL display.

Namely, in order to address or solve the above problem, a method of driving an EL illumination device of the present invention includes driving an illumination device that includes an EL element including at least one organic layer containing a luminescent layer and a pair of electrodes arranged opposite to each other with the organic layer provided therebetween, and a voltage-or-current applying device that applies a voltage or current to the pair of electrodes of the EL element. The magnitude of the voltage or current applied to the EL element during driving is set so that the luminous efficiency of the EL element is 80% or more of the maximum.

Therefore, illumination is performed in a region in which the luminous efficiency of the EL element is best, and thus practical luminance can be efficiently obtained with low power consumption, thereby permitting an attempt to effectively decrease power consumption.

Where the EL illumination device includes a plurality of EL elements producing lights of different colors, the EL elements emitting lights of different colors have different relationships between the magnitude of the applied voltage or current and the luminous efficiency with the applied voltage or current value, and thus the applied voltage or current in driving is preferably set for each color of the EL elements so that the luminous efficiency is 80% or more of the maximum.

In this structure, illumination is performed in a region in which the luminous efficiency of each of the EL elements of different colors, which constitute the illumination device, is best, and thus practical luminance can be efficiently obtained with low power consumption, thereby permitting an attempt to effectively decrease power consumption.

An EL illumination device of the present invention includes an EL element including at least one organic layer containing a luminescent layer and a pair of electrodes arranged opposite to each other with the organic layer provided therebetween, and a voltage-or-current applying device that applies a voltage or current to the pair of electrodes of the EL element. The magnitude of the voltage or current applied to the EL element during driving is set so that the luminous efficiency of the EL element is 80% or more of the maximum.

Therefore, the illumination device is driven in a region in which the luminous efficiency of the EL element is best, and thus practical luminance can be efficiently obtained with low power consumption, thereby effectively decreasing power consumption.

Where the EL illumination device includes a plurality of EL elements producing lights of different colors, the EL elements emitting lights of different colors have different relationships between the magnitude of the applied voltage or current and the luminous efficiency with the applied voltage or current value, and thus the applied voltage or current in driving is preferably set for each color of the EL elements.

In this structure, illumination is performed in a region in which the luminous efficiency of each of the EL elements of different colors, which constitute the illumination device, is best, and thus practical luminance can be efficiently obtained with low power consumption, thereby permitting an attempt to effectively decrease power consumption.

An EL display driving method of the present invention includes driving an EL display that includes a plurality of EL elements each including at least one organic layer containing a luminescent layer and a pair of electrodes arranged opposite to each other with the organic layer provided therebetween, and a voltage-or-current applying device that applies a voltage or current to the pair of electrodes of each of the EL elements, the plurality of EL elements being capable of being driven independently. The magnitude of the voltage or current applied to each of the EL elements during driving is set so that the luminous efficiency of the EL element is 80% or more of the maximum.

Therefore, a display is performed in a region in which the luminous efficiency of each of the EL elements is best, and thus practical luminance can be efficiently obtained with low power consumption, thereby permitting an attempt to effectively decrease power consumption.

In the EL display driving method of the present invention, where the EL display includes a plurality of EL elements producing lights of different colors, the applied voltage or current in driving is preferably set for each color of the EL elements.

In this structure, illumination is performed in a region in which the luminous efficiency of each of the EL elements of different colors, which constitute the device, is best, and thus practical luminance can be efficiently obtained with low power consumption, thereby permitting an attempt to effectively decrease power consumption.

An EL display of the present invention includes a plurality of EL elements each including at least one organic layer containing a luminescent layer and a pair of electrodes arranged opposite to each other with the organic layer provided therebetween, a voltage-or-current applying device that applies a voltage or current to the pair of electrodes of each of the EL elements, and a switching device that individually switches on and off the plurality of EL elements. The magnitude of the voltage or current applied to each of the EL elements during driving is set so that the luminous efficiency of the EL element is 80% or more of the maximum.

Therefore, the EL display is driven in a region in which the luminous efficiency of each of the EL elements is best, and thus practical luminance can be efficiently obtained with low power consumption, thereby effectively decreasing power consumption.

Where the EL display of the present invention includes a plurality of EL elements producing lights of different colors, the applied voltage or current in driving is preferably set for each color of the EL elements.

In this structure, a display is performed in a region in which the luminous efficiency of each of the EL elements of different colors, which constitute the illumination device, is best, and thus practical luminance can be efficiently obtained with low power consumption, thereby permitting an attempt to effectively decrease power consumption.

An EL display of the present invention includes a plurality of EL elements each including at least one organic layer containing a luminescent layer and a pair of electrodes arranged opposite to each other with the organic layer provided therebetween, a voltage-or-current applying device that applies a voltage or current to the pair of electrodes of each of the EL elements, a switching device that individually switches on and off the plurality of EL elements, and a voltage-or-current control device that is capable of changing the magnitude of the voltage or current applied to each of the EL elements during driving in a range in which the luminous efficiency of each of the EL elements is 80% or more of the maximum.

Therefore, a halftone display can be made in the region in which the luminous efficiency of each of the EL elements is best, and thus practical luminance can be efficiently obtained with low power consumption, thereby effectively decreasing power consumption.

Where the EL display includes a plurality of EL elements producing lights of different colors, a full color display can be made in the region the luminous efficiency of each of the EL elements is best, and thus practical luminance can be efficiently obtained with low power consumption, thereby effectively decreasing power consumption.

A liquid crystal device of the present invention includes an EL illumination device of the present invention, and thus a low-power consumption liquid crystal device can be realized.

An electronic apparatus of the present invention includes a liquid crystal device of the present invention or an EL display of the present invention, and thus a low-power consumption electronic apparatus can be realized.

DETAILED DESCRIPTION OF PREFERRED EMBODIMENTS

The present invention will be described in further detail with reference to the drawings.

EL Illumination Device of First Embodiment

Figure 1:
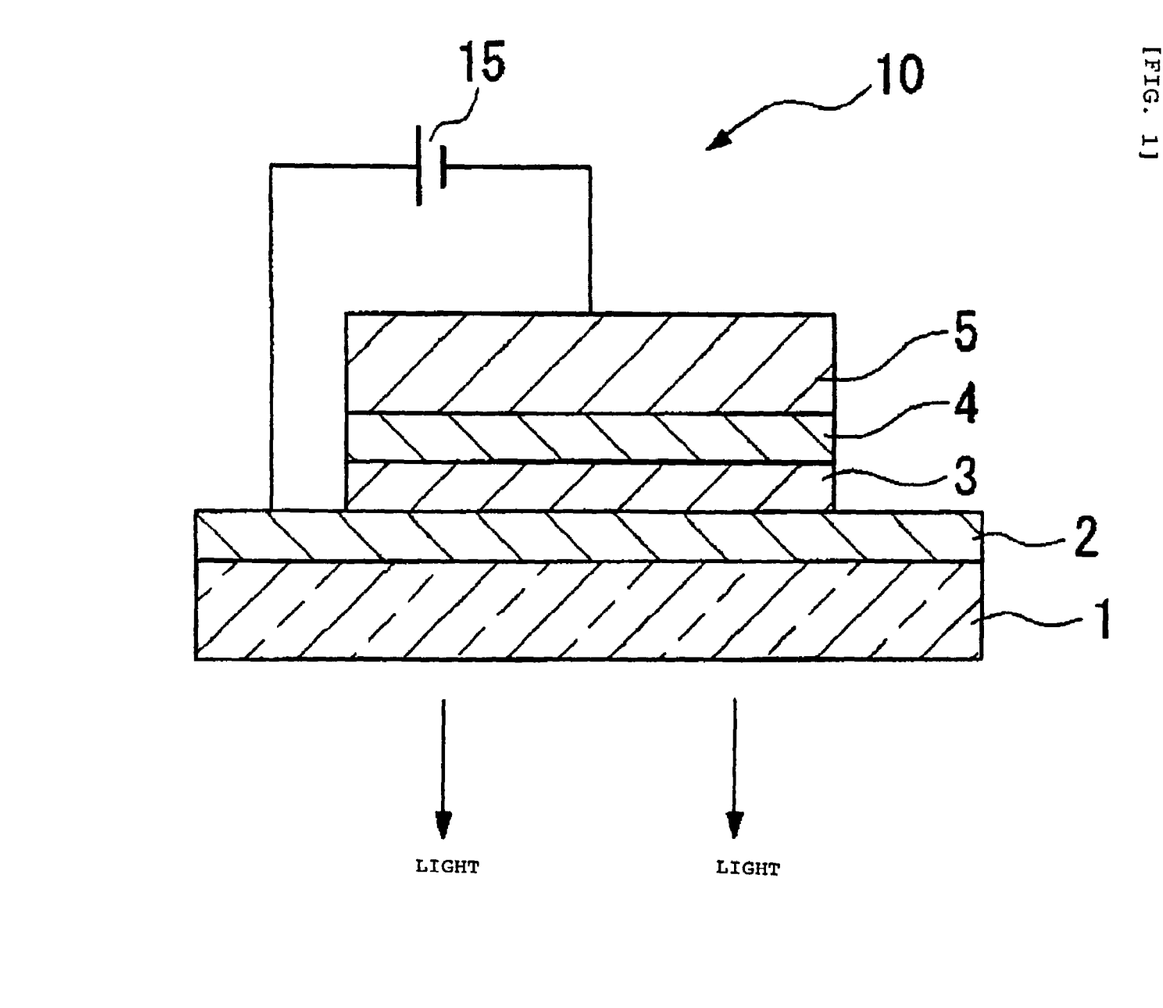
FIG. 1 is a partial sectional view schematically showing an EL illumination device according to an embodiment of the present invention.

FIG. 1 is a schematic sectional view showing an EL element provided in an EL illumination device according to an embodiment of the present invention.

FIG. 1 shows a transparent substrate 1 made of glass or the like. In the EL illumination device of this embodiment, a plurality of EL elements 10 are arranged on or over the transparent substrate 1, and a voltage-or-current applying device 15 is provided to apply a voltage or current between a transparent electrode 2 and a metal electrode 5.

Each of the EL elements 10 includes the transparent electrode 2 made of indium tin oxide (abbreviated to "ITO" hereinafter), a hole transport layer 3 that facilitates injection of holes from the transparent electrode 2, a luminescent layer 4 made of an EL material, and the metal electrode 5, which are laminated in turn on the transparent substrate 1 so that the transparent electrode 2 and the metal electrode 5 are arranged opposite to each other with the luminescent layer 4 provided therebetween.

In each of the EL elements 10 of this embodiment, the transparent electrode 2 functions as an anode, and the metal electrode 5 functions as a cathode.

For the hole transport layer 3, it is possible to use materials conventionally used for hole transport layers, for example, triphenylamine derivatives such as 4,4'-bis(m-triphenylamino)biphenyl (TPD), 4,4'-bis[N-(1-naphthyl)-N-phenylamino]biphenyl (a-NPD), 4,4',4"-tris[N-(3-methylphenyl)-N-phenylamino]triphenylamine (m-MTDATA), and the like; polyvinylcarbazole; polyethylene dioxythiophene; and the like. Also, one or a plurality of materials can be used for the hole transport layer 3.

For the luminescent layer 4, organic EL materials (electroluminescence materials) conventionally used for luminescent layers can be used. Since the color of light emitted from each of the EL elements 10 changes with the type of the organic EL material constituting the luminescent layer 4, the material of the luminescent layer 4 may be appropriately selected according to the color of the intended illumination light.

Examples of EL materials emitting green light include quinacridon and derivatives thereof. EL materials emitting red light include rhodamine and derivatives thereof. EL materials emitting blue light include distyrylbiphenyl and derivatives thereof, cumarine and derivatives thereof, tetraphenylbutadiene and derivatives thereof.

In order to form one luminescent layer 4, one EL material may be used, or a plurality of EL materials may be combined.

For the metal electrode 5, materials conventionally used for metal electrodes, for example, aluminum, silver, silver alloys, magnesium, and the like, can be used.

In order to drive the EL illumination device having the above structure to obtain illumination light, a predetermined voltage or current is applied between the transparent electrode 2 and the metal electrode 5 to emit light from the luminescent layer 4. The light emitted from the luminescent layer 4 is transmitted through the transparent electrode 2 and the transparent substrate 1, and emitted to the exterior of the structure from the transparent substrate 1 (the lower side in FIG. 1)

In setting the applied voltage or current value, the relationship between the applied voltage value or current value (or the current value with the applied voltage) and the luminous efficiency obtained with the applied voltage or applied current value is previously determined for the EL element 10, for example, as shown in FIG. 5. Then, the value of the voltage or current applied between the transparent electrode 2 and the metal electrode 5 is set to the applied voltage value (or current value) V0 or a value near V0 at which the luminous efficiency reaches maximum P. Preferably, the value of the applied voltage or current is set to a value in the range of V1 to V2 in which the luminous efficiency is 80% or more of the maximum P. Particularly, in this range, the value is more preferably set in the range of higher voltages (higher currents) than the applied voltage value (or current value) V0 at which the luminous efficiency reaches the maximum P, i.e., in the range of V0 to V2, because light emission with higher luminance can be obtained with the same luminous efficiency.

Where the plurality of EL elements 10 constituting the EL illumination device are a plurality of types of EL elements including the luminescent layers 4 made of different materials, i.e., a plurality of types of EL elements emitting lights of different colors, the EL elements including the luminescent layers 4 made of different materials have different relationships between the applied voltage or current and the luminous efficiency, the magnitude of the applied voltage or current during driving is set in the above-described preferred range for each type of the EL elements.

In this embodiment, the EL illumination device is driven under a condition in which high luminous efficiency can be obtained from each of the EL elements 10 constituting the EL illumination device, and thus practical luminance can be efficiently obtained with low power consumption, thereby permitting an attempt to effectively decrease power consumption during driving.

By combining the above-described driving method with a structure in which a light scattering layer is provided on the outer surface of the transparent substrate 1 of the EL elements 10 to increase the quantity of light (luminance) emitted from the EL elements 10 by a structural method, emitted light having high luminance can be obtained with low power consumption.

The EL illumination device of this embodiment is preferably used as, for example, illumination devices of various liquid crystal devices, such as a liquid crystal display and a projector, and the like. Accordingly, low power consumption type liquid crystal display can be realized.

EL Display of Second Embodiment

Figure 2:
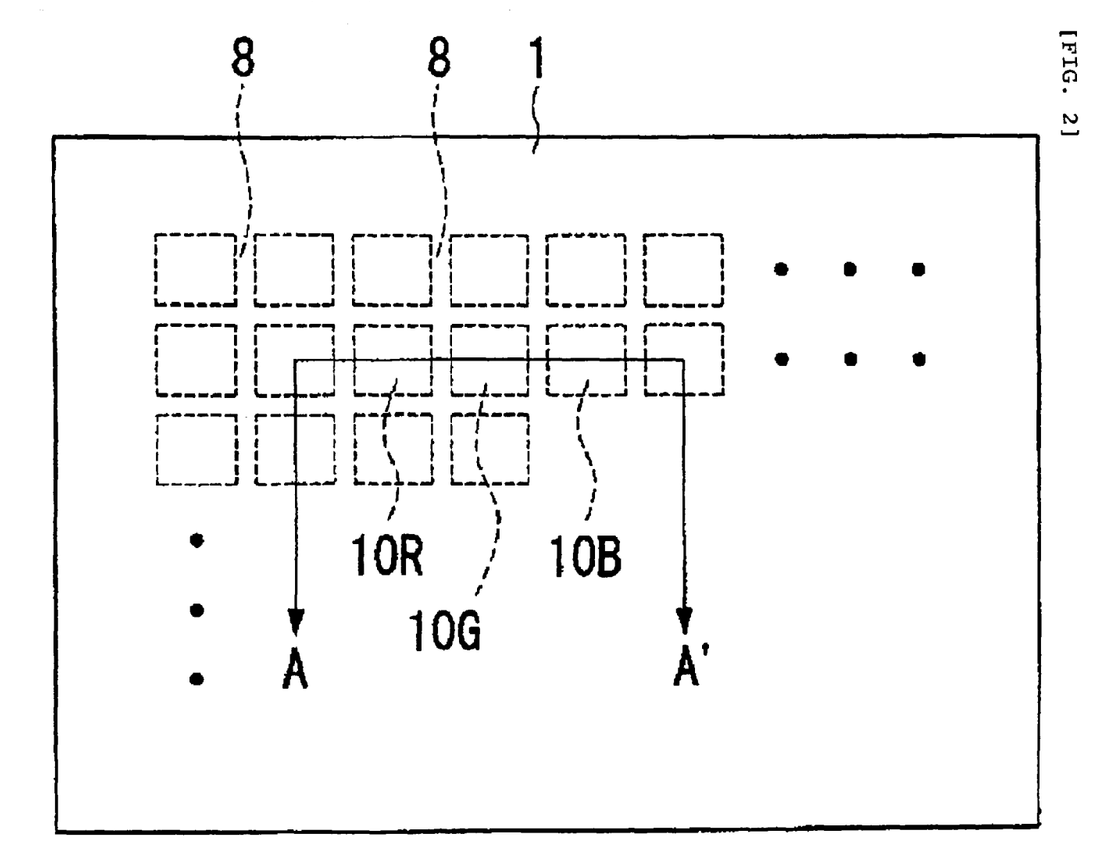
FIG. 2 is a plan view showing an EL display according to an embodiment of the present invention, as viewed from the substrate side.
Figure 3:
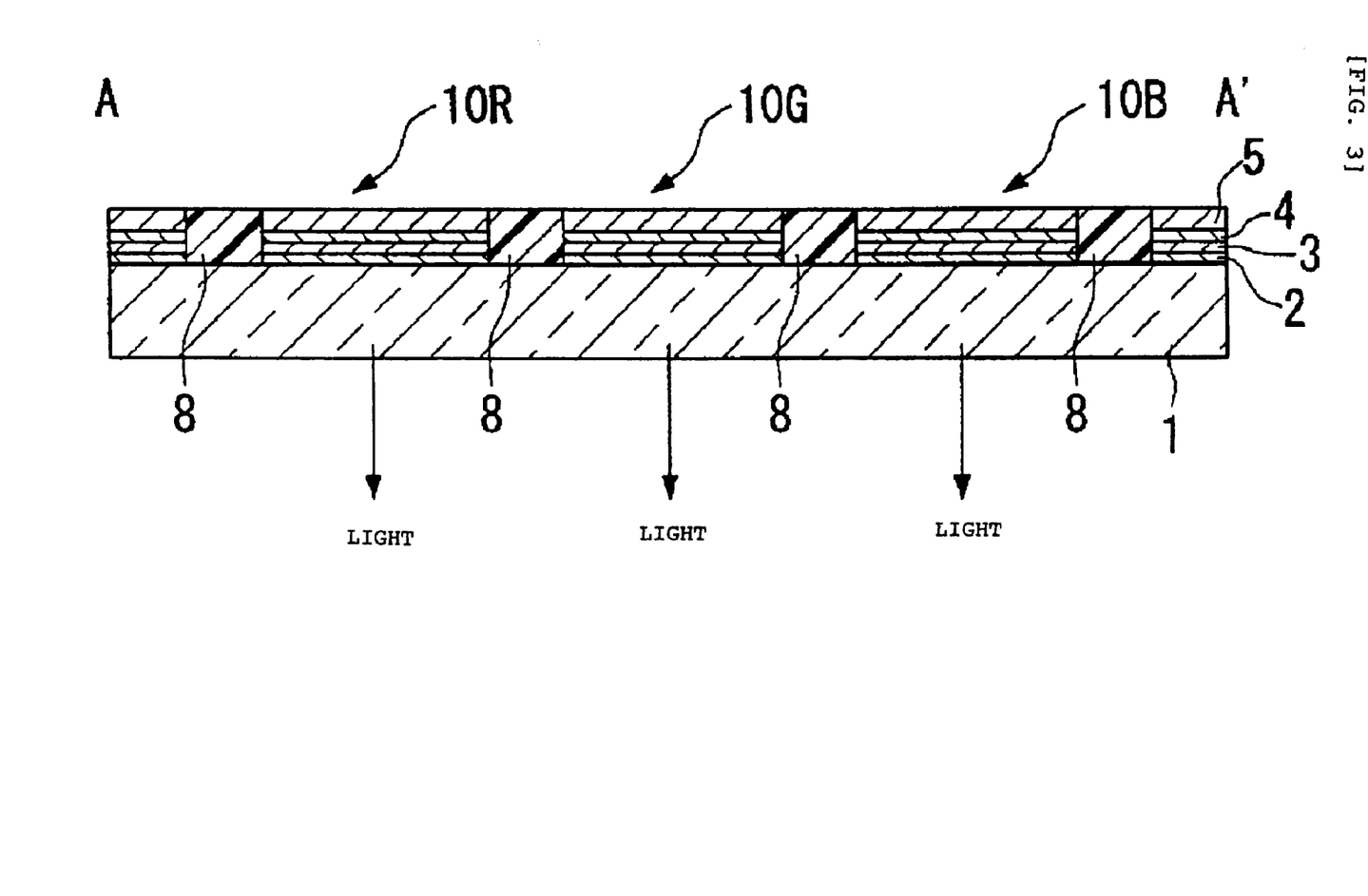
FIG. 3 is a schematic sectional view showing a portion of the EL display shown in FIG. 2, taken along plane A-A' in FIG. 2.

FIG. 2 is a plan view showing an EL display according to an embodiment of the present invention, as viewed from the substrate side. FIG. 3 is a schematic sectional view showing a portion of the EL display shown in FIG. 2.

The EL display of this embodiment includes EL elements 10R emitting red light, EL elements 10G emitting green light, and EL elements 10B emitting blue light, which are arranged in a matrix on a transparent substrate 1 made of glass or the like. Also, a partition 8 that is made of resin black resist or the like is provided around each of the EL elements 10R, 10G and 10B.

Any of the EL elements 10R, 10G and 10B has substantially the same structure as the EL element 10 in the EL illumination device shown in FIG. 1, but the luminescent layers 4 of the EL elements 10R, 10G and 10B are made of different EL materials.

Namely, each of the EL elements 10R, 10G and 10B has a structure in which the transparent electrode 2 including an ITO film, the hole transport layer 3, the luminescent layer 4 made of an EL material, and the metal layer 5 are laminated in turn on the transparent substrate 1.

Although not shown in the drawing, a voltage-or-current applying device is provided to apply a voltage or current between the transparent electrode 2 and the metal electrode 5 of each of the EL elements 10R, 10G and 10B, and a switching device including a thin film transistor (referred to as "TFT") is also provided for individually switching on and off the voltages or currents applied to the respective EL elements 10R, 10G and 10B (not shown in the drawing). In the EL display having the above structure, the EL elements 10R, 10G and 10b respectively form pixels. A voltage or current is applied to the EL element 10R (10G or 10B) of each of pixels, which form an image, by the voltage-or-current applying device and the switching element. When the voltage or current is applied, a current flows through the EL element 10R (10G or 10B) to emit light from the luminescent layer 4. The light emitted from the luminescent layer 4 is transmitted through the transparent electrode 2 and the transparent substrate 1 and emitted to the exterior of the structure from the transparent substrate side (the lower side in FIG. 3) to light a pixel, thereby displaying a color image on the display surface on the transparent substrate 1 side.

In the EL display of this embodiment, the magnitude of the voltage or current applied to each of the EL elements 10R, 10G and 10B is set as follows: The relationship between the applied voltage value or current value (the current value with the applied voltage) and the luminous efficiency obtained with the applied voltage value or current value is previously determined for each of the EL elements 10R, 10G and 10B, as shown in FIG. 5. The relationship between the applied voltage value (current value) and the luminous efficiency varies according to the EL materials used for forming the luminescent layers 4.

For each of the EL elements 10R, 10G and 10B, the value of the voltage or current applied between the transparent electrode 2 and the metal electrode 5 is set to the applied voltage value (or the current value) V0 or a value near V0 at which the luminous efficiency is at the maximum P. Preferably, the value of the applied voltage or current is set to a value in the range of applied voltage values (or current value) V1 to V2 in which the luminous efficiency is 80% or more of the maximum P. Particularly, in this range, the value is more preferably set in the range of higher voltages (higher currents) than the applied voltage value (or current value) V0 at which the luminous efficiency reaches the maximum P, i.e., in the range of V0 to V2, because light emission with higher luminance can be obtained with the same luminous efficiency.

In this embodiment, each of the EL elements 10R, 10G and 10B constituting the EL display is driven under a condition in which high luminous efficiency can be obtained, and thus practical luminance can be efficiently obtained with low power consumption, thereby permitting an attempt to effectively decrease power consumption during driving.

By combining the above-described driving method with a structure in which a light scattering layer is provided, for example, on the outer surface of the transparent substrate 1 to enhance the quantity of light (luminance) emitted from the EL elements 10R, 10G and 10B by a structural method, emitted light with higher luminance can be obtained with low power consumption.

In the EL display of this embodiment, by providing a voltage-or-current control device (not shown in the drawings) capable of individually changing the magnitudes of the voltages or currents applied to the respective EL elements 10R, 10G and 10B, a halftone display can be made in a color image.

In this case, the range of applied voltage values (or current values) V1 to V2 in which the luminous efficiency is 80% or more of the maximum P is determined for each of the EL elements 10R, 10G and 10B, and the voltage (or current) within in this range is applied to the EL elements 10R (10G or 10B) according to the color tone intended for each pixel.

Particularly, within the range of the applied voltage values (or current values) V1 to V2, the value may be set in the range of higher voltages (higher currents) than the applied voltage value (or current value) V0 at which the luminous efficiency reaches the maximum P, i.e., in the range of V0 to V2, because light emission with higher luminance can be obtained with the same luminous efficiency. Therefore, a halftone display is preferably made in the range of lower applied voltages or currents than the applied voltage (or current) V2 at which luminance is maximum.

Since the luminance of light emitted from the EL elements 10R, 10G and 10B varies according to the magnitudes of the voltages or currents applied to the EL elements, the applied voltage or current can be controlled to change the luminance of red light emitted from the EL elements 10R, and/or luminance of green light emitted from the EL elements 10G, and/or luminance of blue light emitted from the EL elements 10B, and thus the color tone of an image to be seen can be subtly changed, thereby permitting a fine halftone display.

Since the voltage or current applied to each of the EL elements 10R, 10G and 10B is changed in the range (V1 to V2) in which high luminous efficiency is obtained, practical luminance can be efficiency obtained with low power consumption, thereby permitting an attempt to effectively decrease power consumption.

Therefore, a full color display can be made with low power consumption.

Although, in each of the embodiments, the EL element including the transparent electrode 2, the hole transport layer 3, the luminescent layer 4G and the metal electrode 5 is described as an example of the EL element of the present invention, the EL element of the present invention is not limited to this example.

[Electronic Apparatus]

Next, examples of electronic apparatuses that each include the EL illumination device or the EL display of the above embodiments will be described below.

Figure 6:
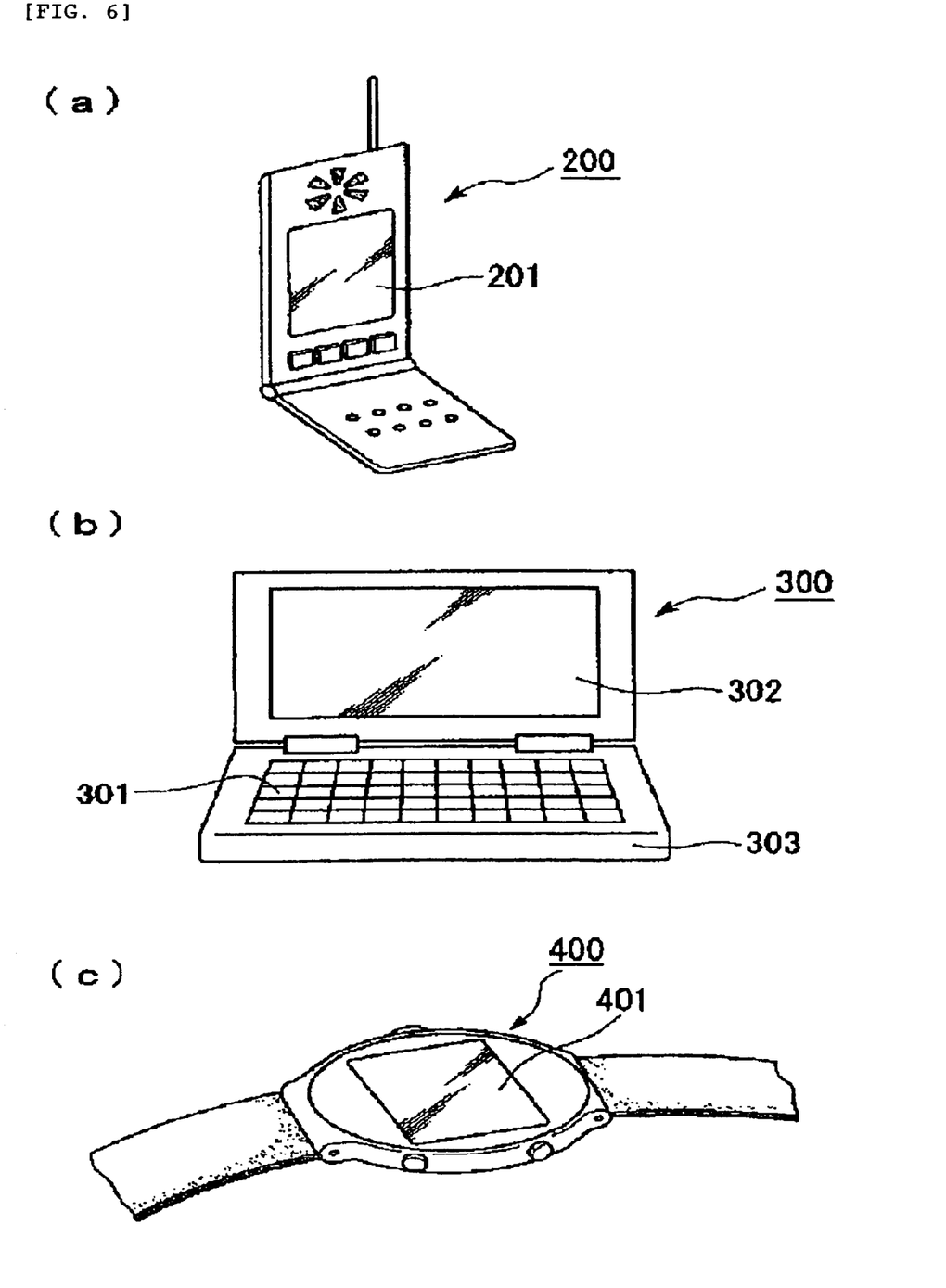
FIG. 6(a) is a perspective view showing an example of a cell phone that includes the EL display of the embodiment of the present invention.
FIG. 6(b) is a perspective view showing an example of a portable information processing apparatus that includes the EL display of the embodiment of the present invention.
FIG. 6(c) is a perspective view showing an example of a wristwatch-type electronic apparatus that includes the EL display of the embodiment of the present invention.

FIG. 6(a) is a perspective view showing an example of a cell phone. In FIG. 6(a), reference numeral 200 denotes a cell phone main body, and reference numeral 201 denotes a display section.

In the cell phone main body 201, the display section 201 can be formed by using a liquid crystal display device including the EL illumination device of the above embodiment, or the EL display of the above embodiment.

FIG. 6(b) is a perspective view showing an example of a portable information processing apparatus, such as a word processor, a personal computer, etc. In FIG. 6(b), reference numeral 300 denotes an information processing apparatus, reference numeral 301 denotes an input section such as a keyboard, or the like, reference numeral 303 denotes an information processing main body, and reference numeral 302 denotes a display section.

In the information processing apparatus 300, the display section 302 may include the liquid crystal display device including the EL illumination device of the embodiment or the EL display of the embodiment.

FIG. 6(c) is a perspective view showing an example of a wristwatch-type electronic apparatus. In FIG. 6(c), reference numeral 400 denotes a wristwatch main body, and reference numeral 401 denotes a display section.

In the wristwatch main body 400 having the above structure, the display section 401 can be formed by using a liquid crystal display device including the EL illumination device of the above embodiment, or the EL display of the above embodiment.

Each of the electronic apparatuses shown in FIGS. 6(a) to 6(c) includes the EL illumination device of the above embodiment, or the EL display of the above embodiment, and thus an image having practical brightness can be obtained with low power consumption.

EXAMPLES

Experimental Example 1

An EL display having the structure shown in FIGS. 2 and 3 was formed according to the above-described embodiment. However, all pixels included EL elements 10 emitting green light. Also, the display screen of the EL display had the same size as the display screen of a 2-inch size cell phone.

Figure 4:
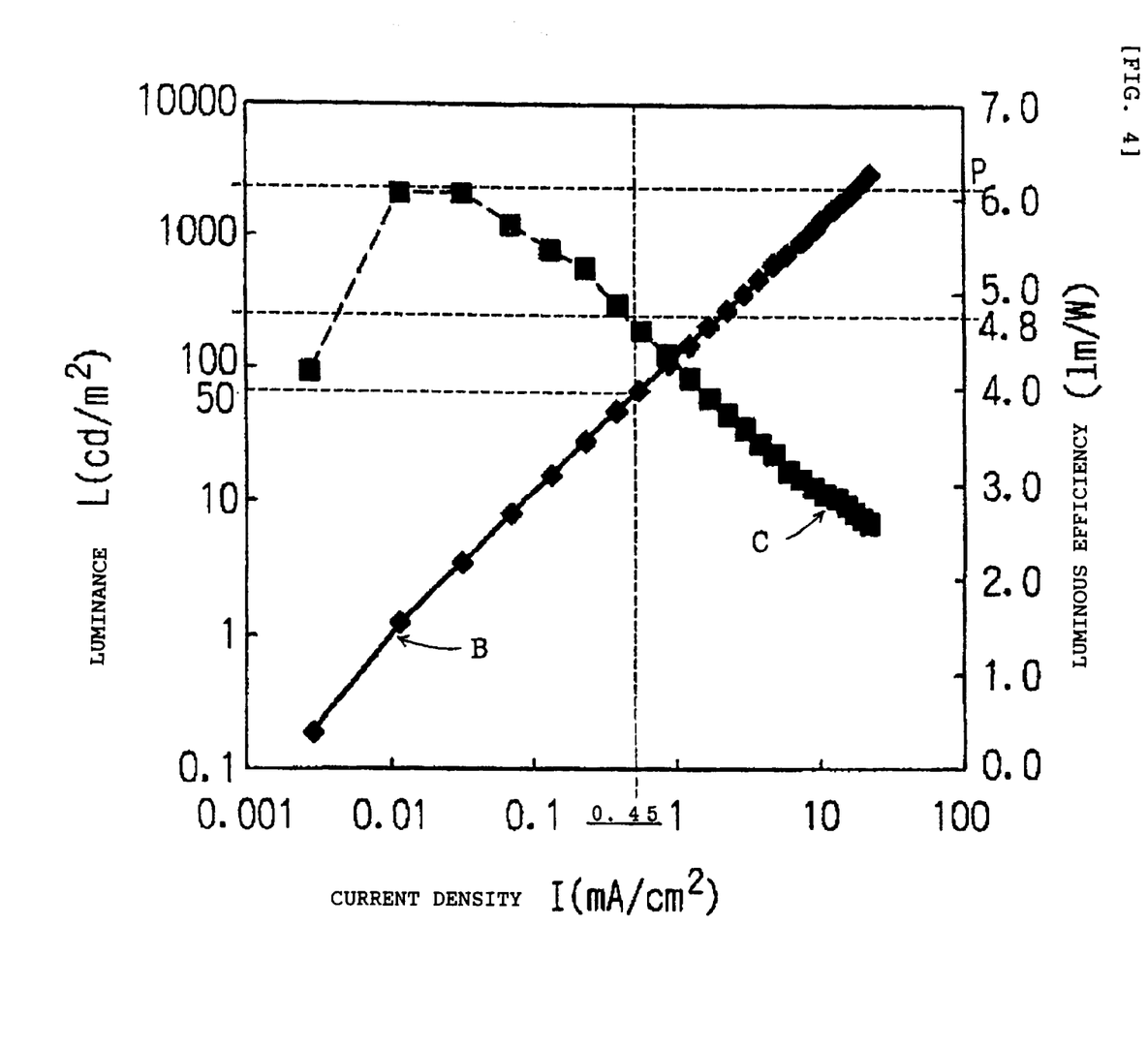
FIG. 4 is a graph showing the relationship between the current density, luminance and luminous efficiency of an EL element.

The changes in luminance and luminous efficiency with changes in magnitude of the voltage or current applied to each of the EL elements 10G used in this example were as shown in FIG. 4. In FIG. 4, the densities (unit: mA/cm2) of currents flowing between the electrodes of each of the EL elements 10G are shown on the abscissa. The luminance (unit: cd/m2) values of light emitted by passing currents with the corresponding current densities are shown on the left ordinate, and the luminous efficiencies (unit: 1 m/W) obtained by passing currents with the corresponding current densities are shown on the right ordinate. In the graph of FIG. 4, the relationship between the current density and luminance is shown by solid line B, and the relationship between the current density and luminous efficiency is shown by broken line C.

The graph indicates that the maximum P of luminous efficiency of the EL elements 10G used in this example is about 6 lumen (1 m)/W. Therefore, a value of 80% of the maximum P of luminous efficiency is about 4.8 lumen (1 m)/W, and thus a halftone display was performed with a current density of less than 0.45 mA/cm2 at which the luminous efficiency was about 4.8 lumen (1 m)/W. Namely, a halftone was set with luminance at a current density of less than 0.45 mA/cm2 so that a luminance of 50 cd/m2 with a current density of 0.45 mA/cm2 was maximum luminance.

A halftone display was actually performed with the applied voltage or current changed so that luminance was in the range of 0 to 50 cd/m2. As a result, the maximum power consumption was about 25 mW, and the average was about 4 mW.

In a color screen display of a related art cell phone using the same EL elements as the EL elements 10G of Experimental Example 1, maximum luminance obtained with a current density of 9 mA/cm2 is about 1000 cd/m2, and a halftone display is performed with a current density lower than this value. In this case, the necessary power consumption is about 885 mW at maximum, and the average is about 400 mW.

Although experimental example 1 was a test for the EL elements 10G emitting green light, tests for the EL elements 10R emitting red light and the EL elements 10B emitting blue light showed the same tendency that luminance increases as the current density increases, but the luminous efficiency has a peak.

For the EL elements 10R (10B), changes in luminance and luminous efficiency with changes in the voltage or current applied to each of the EL elements 10R (10B) were examined in the same manner as described above. Also, a halftone display was performed by using a 2-inch size display screen so that luminance with a luminous efficiency of 80% of the maximum is maximum luminance. As a result, it was found that power consumption was significantly decreased, as compared with the color screen display of a related art cell phone.

In this way, in a halftone display with the EL elements 10R, 10G or 10B constituting the EL display in which luminance with a luminous efficiency of 80% of the maximum is maximum luminance, a display can be performed in a range of enhanced or best luminous efficiency, thereby significantly decreasing power consumption.

Therefore, a full color display can be performed with very low power consumption.

Figure 7:
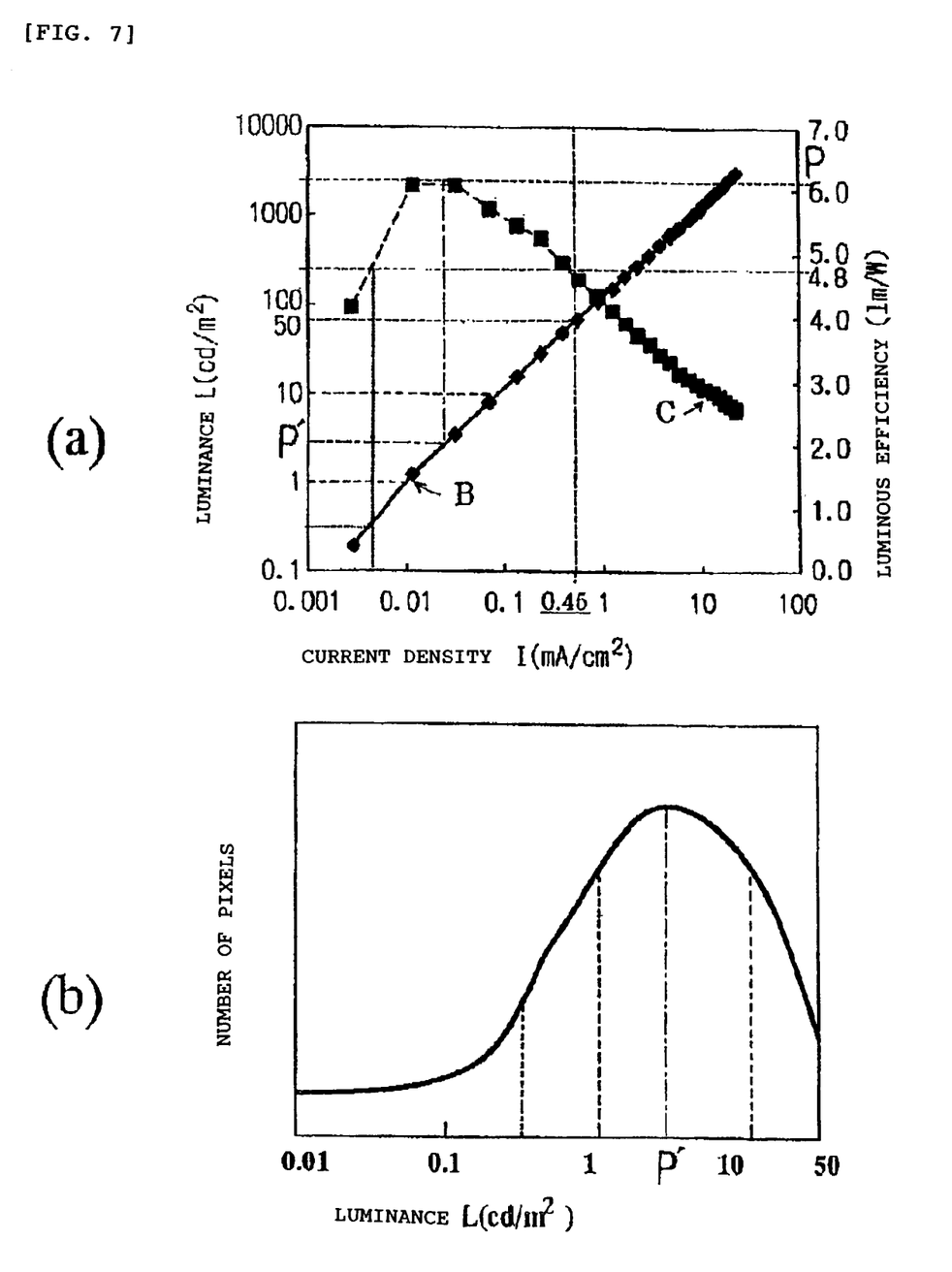
FIG. 7(a) is a graph that shows changes in luminance and luminous efficiency with changes in the current applied to EL elements.
FIG. 7(b) is a graph that shows the results of examining luminance of pixels and the total number of pixels with the corresponding luminance.

FIG. 7(a) shows changes in luminance and luminous efficiency with changes in the current applied to the EL elements 10G. In FIG. 7(a), the densities (unit: mA/cm2) of currents flowing between the electrodes of each of the EL elements 10G are shown on the abscissa. The luminance (unit: cd/m2) values of light emitted by passing currents with the corresponding current densities are shown on the left ordinate, and the luminous efficiencies (unit: 1 m/W) with currents having the corresponding current densities are shown on the right ordinate. In the graph of FIG. 7(a), the relationship between the current density and luminance is shown by solid line B, and the relationship between the current density and luminous efficiency is shown by broken line C.

This graph indicates that the maximum P of luminous efficiency of the EL elements 10G used in this example is about 6 lumen (1 m)/W. Therefore, a value of 80% of the maximum P of luminous efficiency is about 4.8 lumen (1 m)/W, and thus the current density with a luminous efficiency of about 4.8 lumen (1 m)/W is 0.004 mA/cm2 and 0.45 mA/cm2. Therefore, in a halftone display, a halftone was set with luminance at a current density of less than 0.45 mA/cm2 so that a luminance of 50 cd/m2 with the current density upper limit of 0.45 mA/cm2 was maximum luminance.

FIG. 7(b) shows the results of examining luminance of G pixels in a display of a general natural image, which is a full-tone display, with resolution VGA (640×RGB×480). In FIG. 7(b), the luminance values of G pixels are shown on the abscissa, and the total numbers of pixels having the corresponding luminance are shown on the ordinate. The display was performed with luminance in the range of 0 to 50 cd/m2.

As shown by this graph, assuming that the luminance with the maximum display frequency (the number of pixels) in a halftone display is P' in FIG. 7(b), the portion corresponding to luminance P' corresponds to the vicinity of the maximum P of luminous efficiency in FIG. 7(a). In the general natural image, a gray-scale display is in a range in which the luminous efficiency is about 80% of the maximum P, and the ratio of halftone display with luminance near the luminance P' is very high. Therefore, the luminous efficiency of a high ratio of halftone display with luminance near the luminance P' corresponds to the portion near the maximum P. Namely, in a display of a general natural image, power consumption can be significantly decreased in a halftone display having the highest display frequency.

Also, the characteristics of broken line C indicate that the luminous efficiency has a peak at a predetermined current density, and with a luminous efficiency of 80%, there are thus two current density values (the lower limit of 0.004 mA/cm2, and the upper limit of 0.45 mA/cm2) with a predetermined current density value therebetween at which the luminous efficiency is the maximum. Therefore, from the viewpoint of tone distribution of display pixels shown in FIG. 7(b), preferably, the maximum luminance is set so that the luminous efficiency is 80% or more of the maximum, and a possible current density is set to a value higher than the predetermined current density at which the luminous efficiency is the maximum.

As described above, by setting the maximum luminance so that the luminous efficiency is 80% or more of the maximum, a halftone display using most of the pixels can be performed in a range in which the luminous efficiency is enhanced or best, thereby significantly decreasing power consumption.

[Advantages]

As described above, in an EL illumination device and EL display using EL elements according to the present invention, practical luminance can be efficiently obtained with low power consumption by setting the magnitude of the voltage or current applied to each of the EL elements during driving so that the luminous efficiency of the EL elements is 80% or more of the maximum, thereby permitting an attempt to effectively decrease power consumption.

What is claimed is:

1. A method of driving an EL illumination device that includes a plurality of EL elements producing lights of different colors, wherein an EL element within the plurality of EL elements includes at least one organic layer containing a luminescent layer and a pair of electrodes arranged opposite to each other with the organic layer provided therebetween, and a voltage-or-current applying device that applies a voltage or current to the pair of electrodes of the EL element, the method comprising:
   separately setting a magnitude of the voltage or current applied to each of different color EL elements during driving the EL illumination device so that the luminous efficiency of all the different color EL elements is 80% or more of a maximum luminous efficiency of the EL element;
   setting the voltage or current, at which luminance is maximum, in the range of a higher voltage or higher current than the voltage or current at which luminous efficiency reaches the maximum luminous efficiency;
   wherein in setting the magnitude of the applied voltage or current, a relationship between a value of the applied voltage or current and the luminous efficiency obtained with the value of the applied voltage or current, is previously determined for the EL elements.

2. The method of claim 1, wherein the magnitude of the applied voltage or current applied to the EL elements is set so that the current driving the EL elements within the EL illumination device has a current density of 0.45 mA or less.

3. An EL illumination device, comprising:
   a plurality of different color EL elements producing lights of different colors, wherein an EL element within the plurality of EL elements includes:
      at least one organic layer containing a luminescent layer, and
      a pair of electrodes arranged opposite to each other with the organic layer provided therebetween; and
   a voltage-or-current applying device that applies a voltage or current to the pair of electrodes of the EL element, separately setting a magnitude of the voltage or current applied to each of the different color EL elements during driving the EL illumination device being set so that the luminous efficiency of all the different color EL elements is 80% or more of a maximum luminous efficiency of the EL element, the magnitude of the applied voltage or current in driving the EL illumination device being set for each color of the different color EL elements; and
   setting the voltage or current, at which luminance is maximum, in the range of a higher voltage or higher current than the voltage or current at which luminous efficiency reaches the maximum luminous efficiency,
   wherein, in the setting the magnitude of the applied voltage or current, a relationship between a value of the applied voltage or current and the luminous efficiency obtained with the value of the applied voltage or current is previously determined for the EL elements.

4. A liquid crystal device, comprising:
   the EL illumination device according to claim 3.

5. An electronic apparatus, comprising:
   the liquid crystal device according to claim 4.

6. The EL illumination device of claim 3, wherein the magnitude of the applied voltage or current applied to the EL elements is set so that the current driving the EL elements within the EL illumination device has a current density of 0.45 mA or less.

7. A liquid crystal device, comprising:
   the EL illumination device according to claim 6.

8. An electronic apparatus, comprising:
   the liquid crystal device according to claim 7.

9. A method of driving an EL display that includes a plurality of EL elements producing lights of different colors, each EL element within the plurality of EL elements including at least one organic layer containing a luminescent layer and a pair of electrodes arranged opposite to each other with the organic layer provided therebetween, and a voltage-or-current applying device that applies a voltage or current to the pair of electrodes of each of the EL elements, the plurality of EL elements being capable of being driven independently, the method comprising:
   separately setting a magnitude of the voltage or current applied to each of the different color EL elements during driving the EL display so that the luminous efficiency of all the different color EL elements is 80% or more of a maximum luminous efficiency of the EL element; and
   setting the voltage or current, at which luminance is maximum, in the range of a higher voltage or higher current than the voltage or current at which luminous efficiency reaches the maximum luminous efficiency in driving the EL display for each color of the different color EL elements,
   wherein in setting the magnitude of the applied voltage or current, a relationship between a value of the applied voltage or current and the luminous efficiency obtained with the value of the applied voltage or current is previously determined for the EL elements.

10. The method of claim 9, wherein the magnitude of the applied voltage or current applied to the EL elements is set so that the current driving the EL elements within the EL display has a current density of 0.45 mA or less.

11. An EL display, comprising:

a plurality of different color EL elements producing lights of different colors, each different color EL element within the plurality of different color EL elements including at least one organic layer containing a luminescent layer and a pair of electrodes arranged opposite to each other with the organic layer provided therebetween;

a voltage-or-current applying device that applies a voltage or current to the pair of electrodes of each of the different color EL elements during driving the EL illumination device so that the luminous efficiency of all the different color EL elements is 80% or more of a maximum luminous efficiency of the EL element; and a switching device that individually switches on and off the plurality of different color EL elements, a magnitude of the voltage or current applied to each of the different color EL elements during driving the EL display being set so that the luminous efficiency of all the different color EL elements is 80% or more of a maximum luminous efficiency of the EL element, the magnitude of the applied voltage or current in driving the EL display being set for each color of the different color EL elements; and in setting the magnitude of the applied voltage or current, a relationship between a value of the applied voltage or current and the luminous efficiency obtained with the value of the applied voltage or current is previously determined for the EL elements.

12. An electronic apparatus, comprising:
the EL display according to claim 11.

13. The EL display of claim 11, wherein the magnitude of the applied voltage or current applied to the EL elements is set so that the current driving the EL elements within the EL display has a current density of 0.45 mA or less.

14. An electronic apparatus, comprising:
the EL display according to claim 13.

15. An EL display, comprising:

a plurality of different color EL elements producing lights of different colors, wherein each different color EL elements within the plurality of different color EL elements includes at least one organic layer containing a luminescent layer and a pair of electrodes arranged opposite to each other with the organic layer provided therebetween;

a voltage-or-current applying device that applies a voltage or current to the pair of electrodes of each of the different color EL elements during driving the EL illumination device so that the luminous efficiency of all the different color EL elements is 80% or more of a maximum luminous efficiency of the EL element:

a switching device that individually switches on and off the plurality of different color EL elements; and a voltage-or-current control device that is capable of changing a magnitude of the voltage or current applied to each of the different color EL elements during driving the EL display in a range in which the luminous efficiency of all of the different color EL elements is 80% or more of a maximum luminous efficiency of the EL element; and in the setting the magnitude of the applied voltage or current, a relationship between a value of the applied voltage or current and the luminous efficiency obtained with the value of the applied voltage or current is previously determined for the EL elements.

16. The EL display of claim 15, wherein the magnitude of the applied voltage or current applied to the EL elements is set so that the current driving the EL elements within the EL display has a current density of 0.45 mA or less.

* * * * *